Figure 1A:
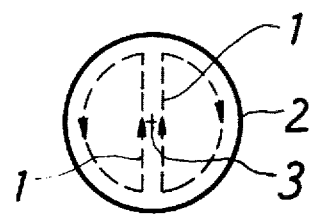
Figure 1B:
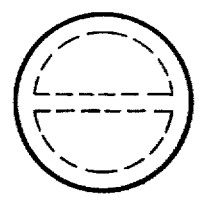
Figure 1C:
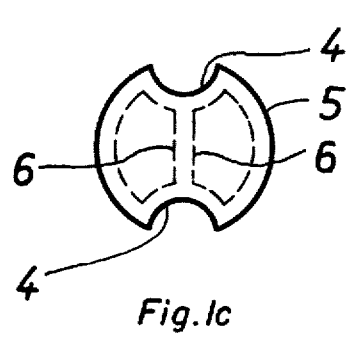
Figure 1D:
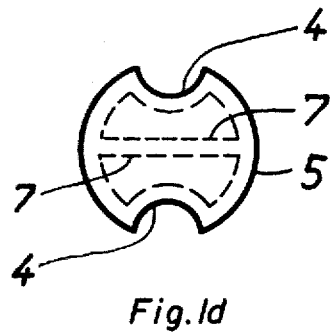

United States Patent [19]

Biehl et al.

[11] 4,315,230
[45] Feb. 9, 1982

[54] TEST HEAD PRODUCING DIFFERENT FREQUENCIES FOR ENDOR-TRIPLE EXPERIMENTS

[75] Inventors: Reinhard Biehl, Kassel; Dieter Schmalbein, Karlsruhe-Durlach, both of Fed. Rep. of Germany

[73] Assignee: Bruker Analytische Messtechnik GmbH, Fed. Rep. of Germany

[21] Appl. No.: 142,652

[22] Filed: Apr. 22, 1980

[30] Foreign Application Priority Data

Apr. 30, 1979 [DE] Fed. Rep. of Germany ....... 2917471

[51] Int. Cl.³ .......................... H01P 7/06; H03C 7/02
[52] U.S. Cl. .................................. 333/227; 332/51 W
[58] Field of Search ............... 333/219, 222, 227, 228; 332/51 W

[56] References Cited

U.S. PATENT DOCUMENTS 2,593,155 4/1952 Kinzer ................................. 333/228

OTHER PUBLICATIONS

Ragan, *Microwave Transmission Circuits*, Rad. Lab. Series 9, McGraw-Hill, N.Y., 1948, Title page & pp. 668, 669.

*Primary Examiner*—Paul L. Gensler

[57] ABSTRACT

A test head for ENDOR-triple experiments comprising a cylindrical cavity resonator provided with means for exciting the $TM_{110}$ mode and a spiral arranged in concentric relation to the cavity axis and connected to the inner conductor of a coaxial line. The walls of the cavity resonator (5) are provided at two diametrically opposite points with projections (4) projecting into the interior of the cavity resonator, consisting preferably of a poorly conductive material and extending over the full height of the cavity resonator. The projections are formed by tubes (14) recessed into the walls of the cavity resonator and enclosing sections (20, 21) of the turns of a modulation coil (19) intended for modulating a D.C. magnetic field ($B_0$) existing in the cavity resonator in vertical relation to the plane comprising the projections.

6 Claims, 2 Drawing Figures

TEST HEAD PRODUCING DIFFERENT FREQUENCIES FOR ENDOR-TRIPLE EXPERIMENTS

The present invention relates to a test head for ENDOR-triple experiments comprising a cylindrical cavity resonator provided with means for exciting the $TM_{110}$ mode and a spiral arranged in concentric relation to the cavity axis and connected to the inner conductor of a coaxial line.

A test head of this type has been known already from J. Chem. Phys. 63, No. 8 (1975), pages 3515 to 3522.

The cavity resonator of the known test head is of circular cross-section and provided on one end face with a small probe taking the form of an extension of the inner conductor of a coaxial line. This probe excites a $TM_{110}$ mode having an orientation such that the magnetic flux lines extending in one diametral plane are oriented perpendicularly to the diametral plane of the cavity resonator in which the excitation probe is arranged. The use of the $TM_{110}$ mode is particularly advantageous because the magnetic field along the axis of the cavity resonator is practically constant with this mode.

If, however, well defined results are to be obtained when carrying out experiments with such a test head, it is a precondition that a defined wave mode with a well defined resonance frequency be given in the cavity resonator. However, this precondition is very difficult to meet because unavoidable dissymmetries resulting from manufacturing tolerances on the one hand and from the introduction of the test material into the space encircled by the spiral on the other hand, render possible the existence behind the cavity resonator of several $TM_{110}$ modes with closely neighbouring resonance frequencies which, related to the axis of the cavity resonator, are rotationally staggered in relation to each other. Now, it is the object of the present invention to improve a test head of the type described above so that only one defined oscillation mode can exist within the cavity resonator in the frequency range of interest.

According to the invention, this problem is solved by projections provided on the walls of the cavity resonator at two diametrically opposite points which project into the interior of the cavity resonator and extend over its entire height.

In such a cavity resonator, two degenerated $TM_{110}$ modes can exist which are substantially orthogonal in relation to each other. The magnetic flux lines of one of the said degenerated modes lie in the same diametral plane as the projections, while the magnetic flux lines of the other one of the degenerated modes lie in a plane perpendicular thereto. For reasons of symmetry, only these two modes are stable. A factor of particular importance must be seen in the fact that the resonance frequencies of these two modes differ considerably so that it is possible to excite selectively one of these modes. In practice, preference will generally be given to the mode whose magnetic flux lines lie in the same diametral plane of the cavity resonator as the projections.

Accordingly, it is rendered possible by the invention, by intentionally disturbing the circular symmetry of the cavity resonator, to excite two different degenerated $TM_{110}$ modes which have resonant frequencies which are sufficiently different to permit the selection of one of these modes and its separation from the other one so that in this manner absolutely defined conditions can be created even in cases where minor dissymmetries exist in the cavity resonator in relation to the projections.

In a preferred embodiment of the invention, the projections are hollow and enclose sections of the turns of a modulation coil intended for modulating a D.C. magnetic field existing in the cavity resonator in vertical relation to the plane comprising the projections. Thus, a very compact arrangement is achieved which enables the coil to be arranged very near the field area to be modulated, without thereby negatively affecting the strength of the resonator construction.

The projections may consist of a poorly conductive metal. The use of a poorly conductive material reduces to a minimum the eddy current losses which otherwise will be caused by the low-frequency A.C. magnetic field. Moreover, the poor conductivity of the surface of the resonator walls in these points help to dampen undesirable oscillation modes of the microwave field within the cavity resonator. On the other hand, the desired degenerated $TM_{110}$ mode is not notably influenced by a poor conductivity of these points of the resonator walls, the wall currents of the degenerated $TM_{110}$ mode being very small in this area.

It is of advantage both for the formation of the degenerated $TM_{110}$ modes and for reasons of manufacture to give the projections a semi-circular cross-section. Such a design of the projections makes it possible in particular to provide in the walls of the cavity resonator, in recessed arrangement, rods or tubes projecting inwardly into the cavity resonator so that the wall sections of the said rods or tubes form the projections. In this case it is possible to produce such a cavity resonator by very simple operations comprising substantially only the drilling of holes for the insertion of the rods or tubes and the boring of a cavity of circular cross-section.

The stability of the oscillating modes in the test head of the invention makes it also possible to provide windows in the walls of the cavity resonator for influencing the sample by visual radiation. In a preferred embodiment of the test head of the invention, at least one of the projections has one such window arranged therein.

Hereafter, the invention will be described and explained in detail with reference to the examples shown in the drawing. It is understood that the features to be derived from the specification and the drawing can be used also for other embodiments of the invention either alone or in any desired combination.

In the drawings

Figure 2:
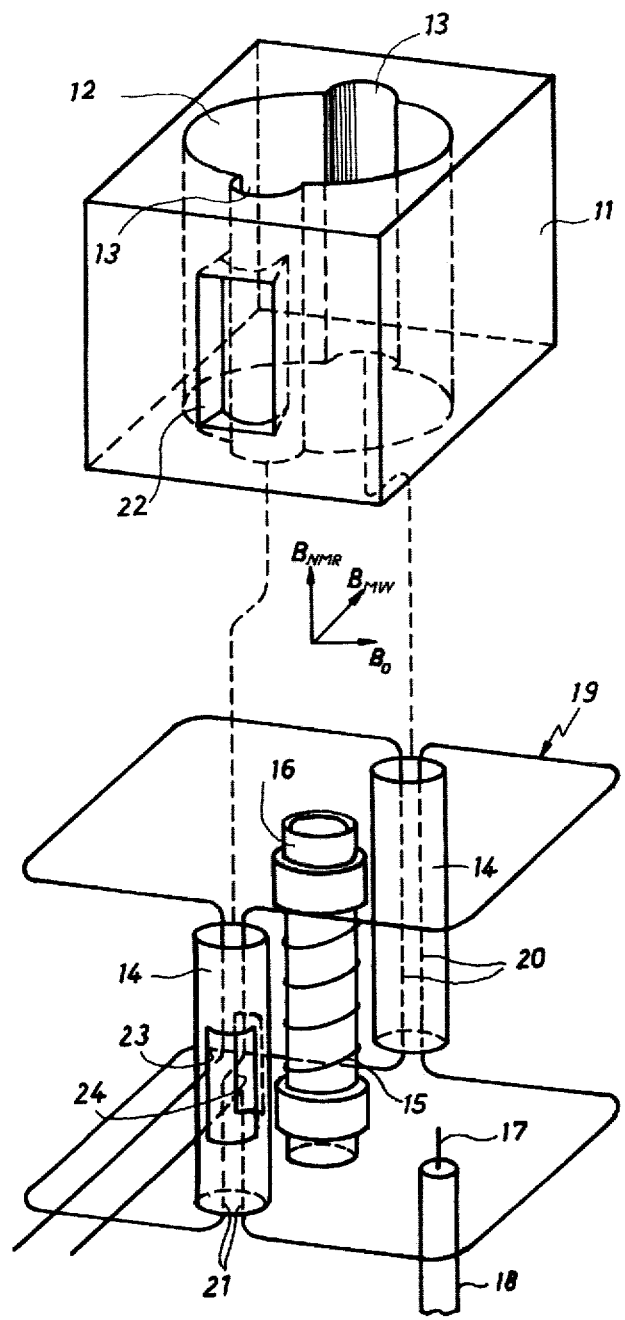

FIG. 1 shows a schematic representation of different vibration modes in the cavity resonator with a circular cross-section and also with a cross-section deformed by recesses, and FIG. 2 shows an exploded schematic representation of a test head designed in accordance with the invention.

In a cylindrical cavity resonator of circular cross-section a vibration mode can be excited which is designated as $TM_{110}$ mode. In FIG. 1 (a), the magnetic field of this mode is represented by dashed lines. This field comprises a component 1 lying in a diametral plane of the cavity resonator 2. The magnetic field has no axial component and, in addition, a field strength independent of the location of the cross-section. Accordingly, the magnetic field existing in the area of the cavity resonator surrounding the axis 3 is extremely homogenous, a fact which is highly desirable for the excitation of samples in ENDOR-triple experiments.

However, the magnetic field has no preferred direction relative to the resonator, in relation to the position of the diametral plane comprising the components 1 of the magnetic field. Although a defined angular position of the magnetic field may be favoured by the arrangement of the means for exciting the vibration mode, it may be possible as a result of certai dissymmetries that several $TM_{110}$ modes may exist in the cavity resonator whose radial components of the magnetic field form an angle between them and whose resonant frequencies are also slightly displaced in relation to each other. The occurrence of such additional vibration modes may invalidate the results of ENDOR-triple experiments. FIG. 1 (b) shows a $TM_{110}$ mode whose radial components of the magnetic field extend perpendicularly to the mode shown in FIG. 1 (a).

The $TM_{110}$ modes shown in FIGS. 1 (a) and 1 (b) degenerate to the modes shown in FIGS. 1 (c) and 1 (d) when the cavity resonator is deformed by projections 4 projecting from diametrally opposed points into the interior of the cavity resonator. In the cavity resonators shown in FIGS. 1 (c) and 1 (d), these projections have a semi-circular cross-section. For symmetry reasons, only two stable degenerated $TM_{110}$ modes exist in this case, namely the mode shown in FIG. 1 (c) which has its radial component 6 of the magnetic field lying in the same plane as the projections 4, and the mode shown in FIG. 1 (d), the magnetic field of which comprises a radial component 7 extending perpendicularly in relation to the plane comprising the projections 4. While the pure $TM_{110}$ modes shown in FIGS. 1 (a) and 1 (b) have the same resonant frequency, the resonant frequencies of the two degenerated $TM_{110}$ modes shown in FIGS. 1 (c) and 1 (d) differ greatly, with a given dimension of the resonator, so that the high frequency coupled into the cavity resonator will excite only one of these two modes, depending on the size of the cavity resonator. So, the arrangement of two projections at diametrically opposite points of the cavity resonator offers the possibility to select a $TM_{110}$ mode which is particularly advantageous for the excitation for a sample, while eliminating at the same time the risk of errors in measurement caused by closely neighbouring resonances resulting from dissymmetries in the test head design.

In the embodiment schematically shown in FIG. 2, the test head comprises a block 11 consisting preferably of a highly conductive metal and provided with a central cylindrical hole or bore 12 of circular cross-section. The wall face of the bore 12 is provided at two diametrically opposite points with recesses 13 of semi-circular cross-section extending over the whole height of the block 11. These recesses 13 may be produced for instance by drilling the corresponding bores into the block 11 prior to boring the cavity. The recesses are intended to receive tubes 14 consisting of a relatively poorly conductive metal. The walls of these tubes 14 are as thin as possible. The tubes are fastened in the recesses 13 of the block 11 so as to ensure a conductive transition between the inner face of the bore 12 and the tube sections 14 which after insertion into the recesses 13 project in the form of projections into the interior of the bore 12. To this end, the tubes 14 may be connected to the block 11 for instance by soldering. The block 11 is closed at its two ends by lids not shown in detail so as to produce a cylindrical cavity resonator having the cross-section shown in FIGS. 1 (c) and 1 (d).

At least one of the lids not shown in the drawing is provided with a central opening permitting the introduction of a spiral 15 into the cavity resonator. The spiral 15 is arranged concentrically to the axis of the bore 12 and encircles concentrically a space intended for receiving a sample. It may for instance be directly applied to the end of a sample 16. The spiral 15 is connected to the end of a coaxial line in a manner not shown in detail and serves for producing a HF field $B_{NMR}$ extending in the direction of the resonator axis.

A probe 17 taking the form of an extended end of the inner conductor of a coaxial line 18 serves to excite a degenerated $TM_{110}$ mode. The coaxial line is connected to the lower lid of the test head in a manner not shown in FIG. 2 to ensure that the probe 17 projects into the cavity resonator formed by the bore 12. The probe 17 is arranged in a radial plane of the cavity resonator extending perpendicularly to the plane in which the tubes 14 are arranged. In this manner, the degenerated $TM_{110}$ mode shown in FIG. 1 (c) is excited in the cavity resonator and produces, accordingly, an A.C. magnetic field $B_{MW}$ in the direction shown in FIG. 2.

In use, the test head is arranged in a stationary magnetic field $B_O$ so that this magnetic field occupies a position perpendicular to the A.C. magnetic fields $B_{NMR}$ and $B_{MW}$, i.e. to the plane defined by the projections of the tubes 14, as shown in FIG. 2. For certain experiments it is advantageous to have the possibility of modulating the stationary magnetic field $B_O$. The embodiment shown comprises for this purpose a magnetic coil 19 having its conductors 20, 21 passing through the tubes 14. This arrangement makes it possible to arrange the coil very close to the field to be modulated. The use of very thin tubes 14 consisting of a poorly conductive material offers the advantage that the eddy current losses caused by the modulation field can be kept very small. At the same time, the poor conductivity of the tubes 14 acts to suppress parasitic vibration modes, for which considerable wall currents are encountered in the area of the tubes 14, while in the case of the degenerated $TM_{110}$ mode used in our example the wall currents in the area of the tubes 14 are almost equal to zero.

Considering that practically no wall currents are encountered in the area of the tubes 14, it is possible to arrange windows in the area of the tubes 14 through which the sample may be exposed to visual radiation. Such radiation may be used for instance for starting or accelerating reactions in the sample substance observed, but also for controlling, for instance, the temperature thereof. Accordingly, the block 11 is provided with a window 22 aligned with corresponding openings 23 and 24 in the associated tube 14. The coil sections 21 may be arranged in the tube 14 in a manner such that they do not hinder the passage of a radiation through the window 22. The configuration of the window 22 and the openings 23, 24 in the tube 14 is preferably such that a sector-shaped opening is provided in the cross-sectional plane of the cavity resonator the centre of which coincides with the cylinder axis of the cavity resonator.

What we claim is:

1. A test head for ENDOR - triple experiments comprising a cylindrical cavity resonator including means for exciting electromagnetic field in the $TM_{110}$ mode, means projecting into the interior of said cavity resonator at diametrically opposite points on the wall thereof and extending over the entire length thereof, said projecting means acting to modify the electro magnetic field to provide resonance conditions for a pair of degenerated $TM_{110}$ modes having different resonance frequencies and being substantially orthogonal to each other.

2. The test head according to claim 1 wherein said projecting means enclose at least a portion of a modulation coil for modulating the magnetic field.

3. The test head according to claim 1 or 2 wherein said projecting means is formed of material less conductive than the material forming the cavity resonator.

4. The test head according to claim 1 or 2 wherein the projecting means have a semi-circular cross-section.

5. The test head according to claims 1 or 2 wherein the wall of said cavity resonator is recessed in the form of a semi-cylindrical cross-section and said projecting means having a circular cross-section being received in part within said recess.

6. The test head according to claim 1 wherein said projecting means is formed with a window into said cavity resonator.

* * * * *